(12) United States Patent
Chen et al.

(10) Patent No.: US 10,966,333 B2
(45) Date of Patent: Mar. 30, 2021

(54) CASE, METHOD OF MANUFACTURING THE SAME AND ELECTRONIC DEVICE

(71) Applicant: GUANGDONG OPPO MOBILE TELECOMMUNICATIONS CORP., LTD., Guangdong (CN)

(72) Inventors: Mingren Chen, Dongguan (CN); Tibo Hou, Dongguan (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 0 days.

(21) Appl. No.: 16/134,301

(22) Filed: Sep. 18, 2018

(65) Prior Publication Data

US 2019/0104628 A1 Apr. 4, 2019

(30) Foreign Application Priority Data

Sep. 29, 2017 (CN) .......................... 201710912435.7

(51) Int. Cl.
*C23F 1/00* (2006.01)
*H05K 5/04* (2006.01)
*C25D 11/12* (2006.01)
*H04M 1/02* (2006.01)
*C23C 28/00* (2006.01)
(Continued)

(52) U.S. Cl.
CPC ............... *H05K 5/04* (2013.01); *C23C 28/00* (2013.01); *C25D 11/12* (2013.01); *C25D 11/16* (2013.01); *C25D 11/24* (2013.01); *G06F 1/1626* (2013.01); *G06F 1/1656* (2013.01); *H01L 21/0223* (2013.01); *H04M 1/0202* (2013.01);
(Continued)

(58) Field of Classification Search
CPC . H01L 21/02299; H01L 21/30604; C23F 1/00
See application file for complete search history.

(56) References Cited

U.S. PATENT DOCUMENTS 9,718,965 B2 8/2017 Rupprecht et al.
2005/0287301 A1* 12/2005 Ljubomirsky ........... B05D 3/12
427/256
(Continued)

FOREIGN PATENT DOCUMENTS

CN 2546462 Y 4/2003
CN 101665971 A 3/2010
(Continued)

OTHER PUBLICATIONS

International search report for Application No. PCT/CN2018/106753, dated Dec. 27, 2018 (4 pages).
(Continued)

*Primary Examiner* — Thomas T Pham
(74) *Attorney, Agent, or Firm* — Ladas & Parry LLP

(57) ABSTRACT

This application provides a method of manufacturing a case, a case and an electronic device. This method may include providing a metal case with a surface; applying a first oxidation treatment on the surface of the metal case to form a first oxidation layer; defining a first area on the surface; removing a portion of the first oxidation layer located within the first area; applying a second oxidation treatment on the surface within the first area to form a second oxidation layer, and forming a paint layer on the second oxidation layer by spraying.

11 Claims, 7 Drawing Sheets

(51) Int. Cl.
*C25D 11/16* (2006.01)
*C25D 11/24* (2006.01)
*G06F 1/16* (2006.01)
*H01L 21/02* (2006.01)
*C25D 11/30* (2006.01)

(52) U.S. Cl.
CPC ......... *H04M 1/0283* (2013.01); *C25D 11/243* (2013.01); *C25D 11/30* (2013.01)

(56) References Cited

U.S. PATENT DOCUMENTS

| | | | |
|---|---|---|---|
| 2011/0155409 A1* | 6/2011 | Du | B32B 37/24 174/50 |
| 2013/0078399 A1 | 3/2013 | Yu et al. | |
| 2014/0076600 A1 | 3/2014 | Browning et al. | |
| 2014/0346049 A1 | 11/2014 | Khosla | |
| 2015/0284868 A1* | 10/2015 | Silverman | C25D 7/00 428/632 |
| 2016/0153109 A1 | 6/2016 | Wei et al. | |
| 2016/0230302 A1* | 8/2016 | Kang | C25D 11/024 |
| 2016/0231775 A1 | 8/2016 | Huang et al. | |
| 2018/0305837 A1* | 10/2018 | Xiong | C25D 11/16 |
| 2018/0310425 A1 | 10/2018 | Liao et al. | |

FOREIGN PATENT DOCUMENTS

| | | |
|---|---|---|
| CN | 101736383 A | 6/2010 |
| CN | 103009693 A | 4/2013 |
| CN | 103255461 A | 8/2013 |
| CN | 103369878 A | 10/2013 |
| CN | 103732023 A | 4/2014 |
| CN | 104278309 A | 1/2015 |
| CN | 104451549 A | 3/2015 |
| CN | 105637120 A | 6/2016 |
| CN | 105637120 A | 6/2016 |
| CN | 105821462 A | 8/2016 |
| CN | 106929851 A | 7/2017 |
| CN | 106929851 A | 7/2017 |
| CN | 107708350 A | 2/2018 |
| WO | WO2015065416 A1 | 5/2015 |
| WO | WO2015065420 A1 | 5/2015 |
| WO | 2017114293 A1 | 7/2017 |
| WO | WO2017114293 A1 | 7/2017 |

OTHER PUBLICATIONS

European search report for Application No. EP18194264.0, dated Jan. 24, 2019 (9 pages).

First Office Action for Application No. CN201710912435.7, dated Mar. 4, 2019 (10 pages).

European examination report for Application No. EP 18194264.0, dated Apr. 1, 2020 (7 pages).

Indian Examination Report, application No. 20181403374 dated Sep. 25, 2020 (7 pages).

* cited by examiner

US 10,966,333 B2

CASE, METHOD OF MANUFACTURING THE SAME AND ELECTRONIC DEVICE

CROSS-REFERENCE TO RELATED APPLICATIONS

The present application claims foreign priority of Chinese Patent Application No. 201710912435.7, field on Sep. 29, 2017 in the State Intellectual Property Office of China, the entire contents of which are hereby incorporated by reference.

TECHNICAL FIELD

The application relates to the electronic device technical field, in particular to a case, a method of manufacturing the same and an electronic device.

BACKGROUND

Nowadays the common raw material for the case of electronic devices, such as smart phones and tablet, is aluminum, aluminum alloy for instance. The raw aluminum that is available on the market cannot be directly used for this purpose due to its stiffness issue. Therefore, the raw aluminum is required to undergo several treatments before being formed into the case. However, since the surface of aluminum is easily oxidized during utilization, it results that the aluminum case cannot satisfy the demand of the electronic devices.

BRIEF DESCRIPTION OF THE DRAWINGS

To better describe the technical solution of this application, a brief description of all the drawings used in this application has been provided as below. Clearly these drawings below are only examples for this application. For those skilled in the art, other drawings can be obtained based on the ones below easily without much of the creative work.

DETAILED DESCRIPTION

Figure 1:
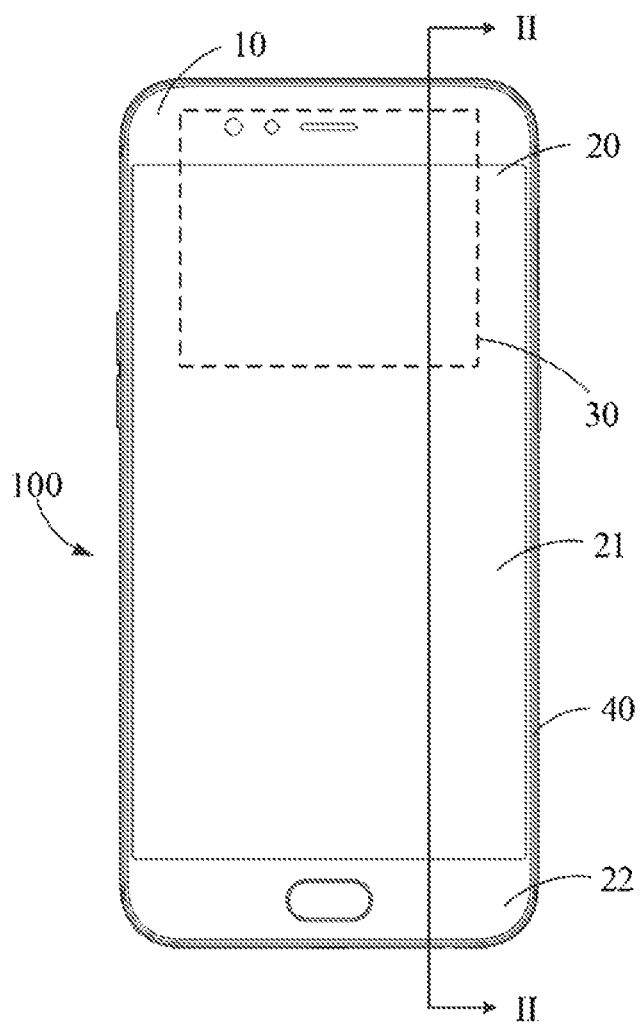
FIG. 1 is a structure schematic view of an electronic device according to an embodiment of the present disclosure.

The application will now be described in detail with reference to the accompanying drawings and examples. Clearly the examples described here are only part of the ones within this application, not all of them. All the other examples that the technical staff in the same field can obtain without creative work based on the ones in this application, are within the protection of this application.

In the specification of the present disclosure, it is to be understood that terms such as "central," "longitudinal," "lateral," "length," "width," "thickness," "upper," "lower," "front," "rear." "left," "right," "vertical," "horizontal," "top," "bottom," "inner," "outer," "clockwise," "counterclockwise," refer to the orientations and locational relations illustrated in the drawings, and for describing the present disclosure and for describing in a simple manner, and which are not intended to indicate or imply that the device or the elements are disposed to locate at the specific directions or are structured and performed in the specific directions, which could not to be understood as limiting the present disclosure. In addition, terms such as "first" and "second" are used herein for purposes of description and are not intended to indicate or imply relative importance or significance or to imply the number of indicated technical features. Thus, the feature defined with "first" and "second" may comprise one or more of such a feature. In the description of the present disclosure, "a plurality of" means two or more than two, unless specified otherwise.

In the present disclosure, unless specified or limited otherwise, terms "mounted," "connected," "coupled," and the like are used in a broad sense, and may include, for example, fixed connections, detachable connections, or integral connections; may also be mechanical or electrical connections; may also be direct connections or indirect connections via intervening structures; may also be inner communications of two elements, as can be understood by those skilled in the art depending on specific contexts.

The following contents in this document provide different examples for the implementation of the different structures in this application. To simplify the application, the content below describes the components and settings for a specific example. Nevertheless, the components and settings are only for demonstration purpose, not to be considered as restrictions to this application. Furthermore, the reference number and/or letter in this application can be repetitively used in different examples. It aims to simplify and clarify the application, with no intention on indicating the relationship between different examples and/or settings. In addition, this application provides examples of several different specific technology and material, which can be extended to implementations on other technology and/or material by the technical staff within the same field.

The present disclosure provides an electronic device. It can be smart phones, tablets and other devices. Referring to FIG. 1, the electronic device 100 may include a cover plate 10, a display screen 20, a circuit board 30, and a case 40.

The cover plate 10 may be installed on the display screen 20 to cover the display screen 20. The cover plate 10 can be of transparent glass. It also can be made by other materials like sapphire in other embodiments.

The display screen 20 may be installed on the case 40 to form the display surface of the electronic device 100. In some embodiments, the display screen 20 may include a display area 21 and a non-display area 22. The display area 21 may be used to display image, text and other information, while the non-display area 22 does not display any information. At the bottom of the non-display area 22, functional modules like fingerprint module and touch control circuit can be disposed.

In some embodiments, the display screen 20 can be either a LCD screen or an OLED screen.

The circuit board 30 may be installed inside the case 40. It can be the motherboard of the electronic device 100. The circuit board 30 can be integrated with camera, proximity sensor, processors and other functional modules. Furthermore the display screen 20 can be electrically connected to the circuit board 30.

In some embodiments, a display control circuit may be set on the circuit board. The display control circuit may be configured to output electronic signal to the display screen 20 so as to control the display screen 20 to display information.

The case 40 may be configured to accommodate the internal electronic elements of the electronic device 100, such as circuit boards and battery. Moreover, the case 40 may define the external outline of the electronic device 100.

Figure 2:
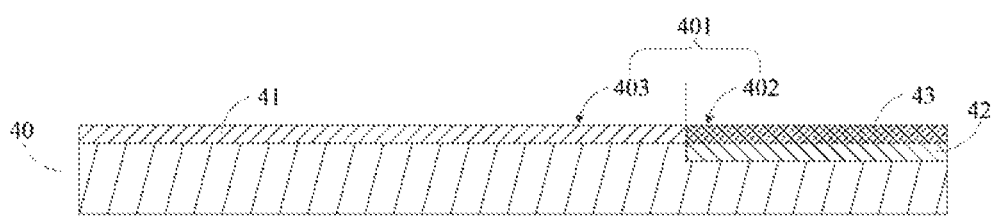
FIG. 2 is a cross-sectional view of the case for the electronic device shown in FIG. 1.

In some embodiments, referring to FIG. 2 which is the section view of the case 40 of the electronic device 100 in FIG. 1 taken along the line II-II. The case 40 may be a metal case, which can be made of steel, aluminum, aluminum alloy or magnesium alloy for instance. FIG. 2 only schematically shows parts or all of the different structures of the case 40. The surface of the case 40 may be flat as shown in FIG. 2. In other embodiments, the case 40 may alternatively have a curved surface.

It needs to clarify that, in the practical application, non-metal elements may be attached on the metal case 40 of the electronic device. For example, plastic elements can be attached on one side of the case 40. Under this circumstance, the part that is attached to the case 40 can be installed onto the case 40 after the completion of the manufacture of the case. Therefore, the non-metal elements attached to the case 40 should not be considered as part of the case. The present disclosure will only describe the metal case.

The case 40 may have a surface 401. The surface 401 may be the outer surface of the case 40, which is the surface of the electronic device 100 which can be seen by the users. In some embodiments, the case 40 may be the back case or the battery case of the electronic device 100, and hence the surface 401 may be the back surface of the case 40 or the electronic device 100. The surface 401 may be divided into a first area 402 and a second area 403. A first oxidation layer 41 may be formed within the second area 403, a second oxidation layer 42 may be formed within the second area 402 and a paint layer 43 may be formed on the second oxidation layer 42.

The first oxidation layer 41 and the second oxidation layer 42 can be formed by oxidizing the metal material of the case 40. For example, the metal material of the case 40 may be aluminum alloy, so the first oxidation layer 41 and the second oxidation layer 42 can be aluminum oxide. The first oxidation layer 41 and the second oxidation layer 42 may each have a thickness of tens of micrometers, 30 micrometers for instance. The thickness of the case 40, on the other hand, can be several millimeters, 4 millimeters for instance. Hence the thickness of the first oxidation layer 41 and the second oxidation layer 42 are very small compared with that of the case 40.

In some embodiments, the first oxidation layer 41 and the second oxidation layer 42 may form a step configuration, that is, a height difference may exist between the surface of the first oxidation layer 41 and the second oxidation layer 42 along the thickness direction of the case 40. The underside of the first oxidation layer 41 (i.e., the fusion surface of the first oxidation layer 41 and the metal part of the case 40) may be at the same height level with the surface of the second oxidation layer 42. Since the thickness of the first oxidation layer 41 may be substantially the same as that of the paint layer 43, the surface of the first oxidation layer 41 may be at substantially the same level with the surface of the paint layer 43. Therefore, there is no height difference between the different areas on the surface 401 of the case 40, which presents a flat and smooth surface to the users.

In some embodiments, the paint layer 43 can be made of transparent paint. Under this circumstance, the surface 401 of the case 40 may present the colors of both the first oxidation layer 41 and the second oxidation layer 42. The first oxidation layer 41 and the second oxidation layer 42 can be colored to show up in different colors, for example, blue for the first oxidation layer 41 and red for the second oxidation layer 42. Hence the surface 401 of the case 40 can present a dual-color visual effect to users.

It needs to clarify that although the surface 401 of the case 40 shown in FIG. 2 only shows two areas 402 and 403, the surface 401 can include several areas in other embodiment. For instance, there can be three or four areas defined on the surface 401. If an oxidation layer with a respective color is formed within each of these areas, the surface 401 of the case 40 may present a multi-color visual effect to users.

According to the present application, the first oxidation layer 41 and the second oxidation layer 42 may be formed on the surface 401 of the case 40, and the paint layer 43 may be formed on the second oxidation layer 42. Thus, the first oxidation layer 41, the second oxidation layer 42 and the paint layer 43 may protect the case 40 from oxidizing during the use of the case 40. Therefore, the implementation of the present application may improve the corrosion resistance of the case 40 as well as its structural stability such that the service life of the electronic device 100 may be extended.

Figure 3:
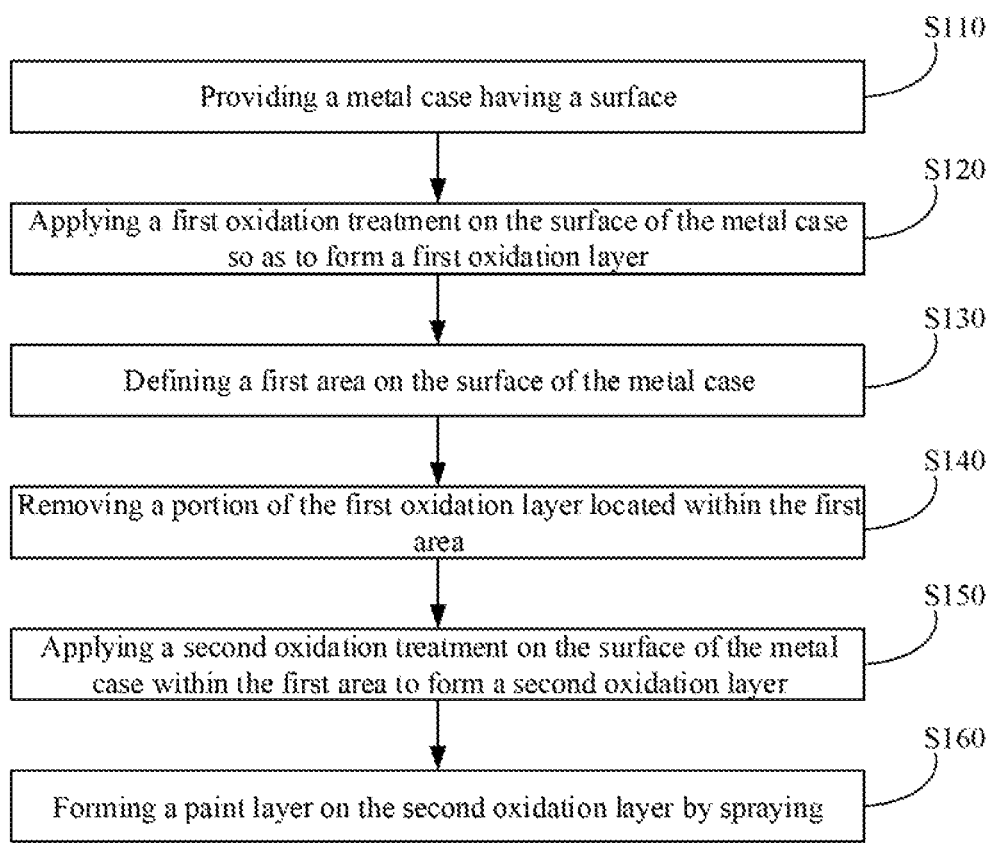
FIG. 3 is a flow chart of a method for manufacturing a case according to an embodiment of the present disclosure.

The embodiments of the present disclosure also provide a method of manufacturing the case. The method is used to manufacture the case. The case can be used for the electronic device 100 described above. Referring to FIG. 3, the method of manufacturing the case may include the following blocks:

S110: Providing a metal case having a surface.

Figure 5:
FIG. 5 shows one form of the case during the manufacturing process according to an embodiment of the present disclosure.

During the manufacturing process of the case, a metal case may be provided, such as the case 40 shown in FIG. 5. The case 40 may be a metal case made of steel, aluminum, aluminum alloy and the like. The thickness of the case 40 can be several millimeters, 4 millimeters for instance. The case 40 may have a surface 401 as its outer surface, which is the side of the electronic device that can be seen by the users. In some embodiments, the case 40 may be the back case or the battery case of an electronic device and the surface 401 may be the back surface of the electronic device. The surface 401 may be a flat surface or a curved surface.

The size and shape of the case 40 may be determined according to product design and will not be limited in the present disclosure.

S120: Applying a first oxidation treatment on the surface of the metal case to form a first oxidation layer.

Figure 6:
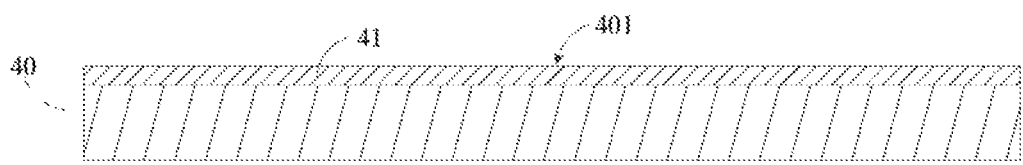
FIG. 6 shows another form of the case during the manufacturing process according to an embodiment of the present disclosure.

After the case 40 is obtained, a first oxidation treatment may be performed to the surface 401 of the case 40, to form the first oxidation layer 41, as shown in FIG. 6. The first oxidation treatment may refer to any process capable of oxidizing the surface 401 of the case 40 to form the first oxidation layer 41.

In detail, an anodizing process can be used to oxidase the surface 401 of the case 40. In some embodiments, anodic oxidation technique may be applied. Specifically, the surface 401 of the case 40 may be placed in an electrolyte (e.g., dilute sulfuric acid), and then current may be applied to the case 40. The case 40 may act as the anode, while a lead plate or a carbon rod may act as the cathode, such that the anodizing process of the case 40 can be implemented. After the completion of oxidization, the first oxidation layer 41 may be formed on the surface 401 of the case 40. The thickness of the first oxidation layer 41 can be tens of micrometers, 30 micrometers for instance.

S130: Defining a first area on the surface of the metal case.

Figure 7:
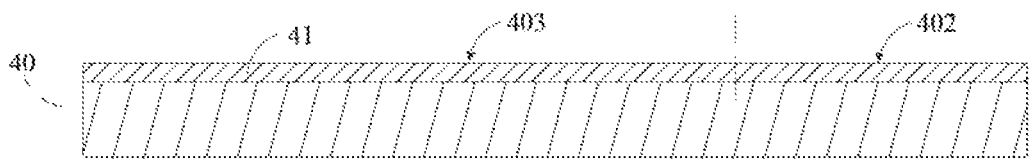
FIG. 7 shows another form of the case during the manufacturing process according to an embodiment of the present disclosure.

After the first oxidation layer is formed on the surface 401 of the case 40, a first area 402 may be defined on the surface 401 as shown in FIG. 7. The size of the first area 402 can be determined according to user's requirement. For example, the first area 402 can be the bottom half or the top half of the case 40. Alternatively, the first area 402 may be the left half or the right half of the case 40. In other embodiments, the first area 402 may also be a circular area or an annular area.

S140: Removing a portion of the first oxidation layer located within the first area.

Figure 9:
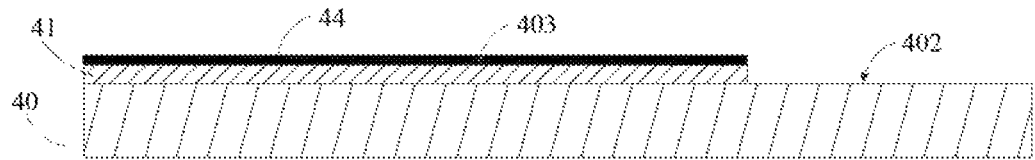
FIG. 9 shows another form of the case during the manufacturing process according to an embodiment of the present disclosure.

After the definition of the first area 402 on the surface 401 of the case 40, the portion of first oxidation layer 41 located within the first area 402 can be removed either physically or chemically, as shown in FIG. 9. After the portion of first oxidation layer 41 located within the first area 402 is removed, the remaining first oxidation layer 41 may form a step configuration on the surface of the case 41, that is, a height difference may exist. Understandably, since the thickness of the first oxidation layer 41 is small, the height different may also be very small. At this stage, what is exposed within the first area 402 is no longer the oxidized material, but the original metal material of the case 40, for example, aluminum material.

S150: Applying a second oxidation treatment on the surface of the metal case within the first area to form a second oxidation layer. The second oxidation treatment may refer to any process capable of oxidizing the surface 401 within the first area 402 to form the second oxidation layer 42.

Figure 11:
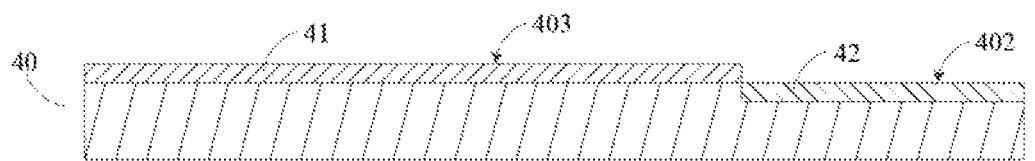
FIG. 11 shows another form of the case during the manufacturing process according to an embodiment of the present disclosure.

In detail, after the portion of first oxidation layer 41 within the first area 402 is removed, another oxidizing process, i.e., the second oxidation treatment, may be then applied on the surface within the first area 402 to form the second oxidation layer 42 within the first area 402, as shown in FIG. 11. In other word, the original metal material of the case 40 which has been exposed during the block S140 may be oxidized. To form the second oxidation layer 42. The detailed oxidizing process of the first area 402 can refer to the description in S120 above, and will not be discussed hereon. It should be noticed that the specific condition and parameters of the second oxidation treatment may be same as or different from that of the first oxidation treatment. The thickness of the second oxidation layer can be tens of micrometers, which can be different from or equal to that of the first oxidation layer 42. For example, the thickness of the second oxidation layer 42 may be 40 micromeres. After the second oxidation layer 42 is formed within the first area 402, is a height difference may exist between a top surface of the first oxidation layer 41 and a top surface of the second oxidation layer 42 along the thickness direction. The height difference may be equal to the thickness of the first oxidation layer 41.

S160: Forming a paint layer on the second oxidation layer by spraying.

After the second oxidation layer 42 is formed on the surface within the first area 402, a paint layer 43 can be formed on the second oxidation layer 42 by spaying, as shown in FIG. 2. The thickness of the paint layer 43 may be the same as that of the first oxidation layer 41, and hence the top surface of the first oxidation layer 41 may be at the same height as the top surface of the paint layer 43. In other word, there is no height difference between the different areas on the surface 401 of the case 40, which presents a flat and smooth surface to the users.

According to the present disclosure, the first oxidation layer, the second oxidation layer and the paint layer may be respectively formed on the metal case. Thus, when manufacturing the case, the manufacturer may have more options on coloring or surface-processing the case. Therefore, the implementation of the present disclosure may render more flexibility to the manufacturer during the manufacture of the case.

Figure 4:
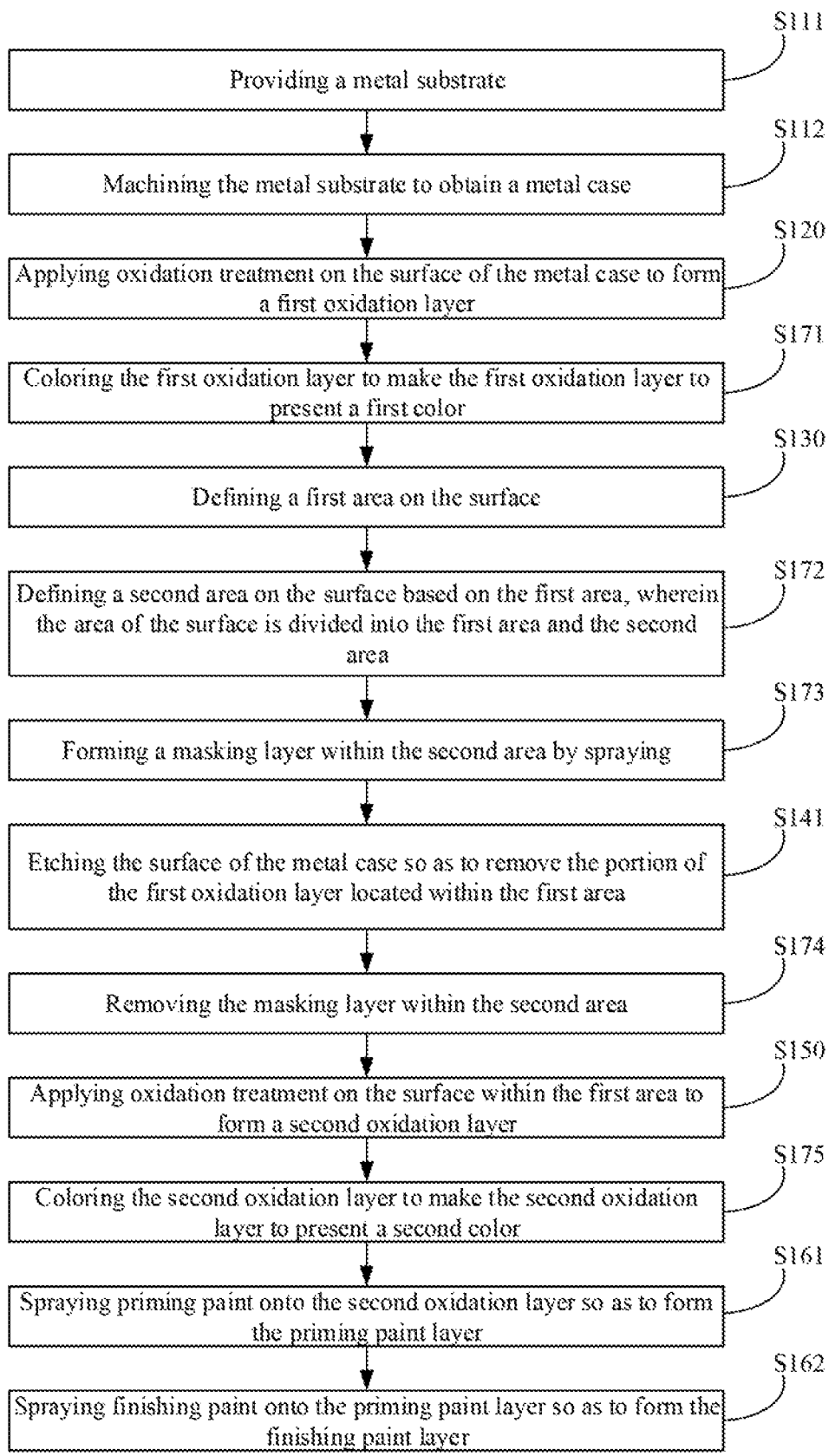
FIG. 4 is a flow chart of the method for manufacturing a case according to another embodiment of the present disclosure.

In some embodiments, as shown in FIG. 4, the block of S110 of providing a metal case may include the following sub-blocks:

S111: Providing a metal substrate.

S112: Machining the metal substrate to obtain a metal case.

During the manufacture of the case, a metal substrate may be firstly provided. The metal substrate can be the metal plate material available on the market, such as aluminum or aluminum alloy plate. Then the metal substrate may be machined to obtain the metal case with required shape, size, and thickness. The machining process can include cutting, forging, stamping or other processes.

In some embodiments, before the block S120 of applying oxidation treatment on the surface of the metal case to form the first oxidation layer, a sandblasting treatment may be applied to the surface of the metal case so that a sandblasting surface may be formed.

Sandblasting is a process of cleaning and roughening an object surface by utilizing the impact from high-speed sand flow. During this process, compressed air may be used as the source of power to form a high-speed beam to spray the sand material (e.g., copper ore sand, quartz sand, emery sand, iron sand, Hainan sand etc.) onto the surface of the workpieces to be treated. The surface of the workpiece may undergo the impact and cutting effects of the spray beam to obtain the required roughness. After the sandblasting treatment, the sandblasting surface formed on the surface of the metal case may gain a certain level of roughness, and hence the graininess texture can be sensed by the user during utilization.

In this embodiment, the first oxidation layer which is formed on the surface of the metal case after the formation of the sandblasting surface may also be a sandblasting surface, and hence the first oxidation layer may also present the graininess texture.

In some embodiments, before applying the sandblasting treatment to the surface of the metal case, a polishing treatment can be performed to the surface of the metal case to make the surface of the metal case flat and smooth.

The polishing treatment is a process of utilizing either mechanical, chemical or electrochemical technology to reduce the roughness of the workpiece surface, and to obtain a bright and smooth surface. After the polishing treatment, the surface of the metal case can become flat and smooth, which may facilitate further processing.

In some embodiments, the polishing treatment to the metal case is via grinding. Grinding is a process that changes the physical performance of material surface through the friction created by other rough objects (such as sand paper or polishing wheel that contains high stiffness particles). For example, by grinding the surface of the metal case using a polishing wheel with very fine particles, the surface of the metal case may become flat and smooth.

In some embodiment, after the block S120 of applying oxidation treatment on the surface of the metal case to form the first oxidation layer, a thin film layer which covers the first oxidation layer may be formed on the surface of the metal case by applying physical vapor deposition (PVD) on the surface of the metal case.

The PVD treatment is a process of transferring atoms or molecules from the raw material to the surface of a workpiece. It sprays small particles with special characteristics (such as high stiffness, high wearing resistance, high heat dissipation rate, or high corrosion resistance etc.) to the workpieces to improve their performance.

The thickness of the thin film layer formed by the PVD treatment may be less than that of the first oxidation layer. Furthermore, this thin film layer can be transparent. Therefore, it will not impact the texture of the sandblasting surface on the surface of the metal case.

In some embodiments, as shown in FIG. 4, after the block S120 of applying oxidation treatment on the surface of the metal case to form a first oxidation layer, the method of manufacturing the case may further include the following block:

S171: Coloring the first oxidation layer to make the first oxidation layer to present a first color.

After the first oxidation layer is on the surface of the case, a coloring treatment can be performed to the first oxidation layer. In detail, the surface of the first oxidation layer after the oxidization process may be porous, that is, there may exist many small pores on the surface of the first oxidation layer. These pores can absorb dyes and crystal water. To enable the surface of the case to present the required color for decoration purpose, after the completion of the oxidization of the case surface, the case can be placed in the dye for surface coloring treatment. After the coloring treatment, the first oxidation layer can present the required first color, such as blue.

In some embodiments, as shown in FIG. 4, after the block S130 of defining the first area on the surface, the method of manufacturing the case may further include the following blocks:

S172: Defining a second area on the surface based on the first area. The area of the surface may be divided into the first area and the second area.

S173: Forming a masking layer within the second area by spraying.

As shown in FIG. 7, after the definition of the first area 402 on the surface of the case 40, the second area 403 can be defined on the surface of the case 40 based on the first area 402. The size of the first are 402 can be determined upon the request. The second area 403 may be located outside the first area 402. The second area 403 can be all the other areas on the surface of the case 40 except the first area 402, that is, the combination of the first area and the second area may correspond to the whole area of the case 40. Alternatively, the size of the second area 403 can be smaller than the surface of all the other areas on the surface of the case 40 except the first area 402, that is, the combination of the first area and the second area may only correspond to part of the area of the surface of the case 40. It is to be understood that there may be no overlap between the second area 403 and the first area 402. The first area 402 and the second area 403 can be determined by the production specifications which is not limited in the embodiments of the present disclosure.

Figure 8:
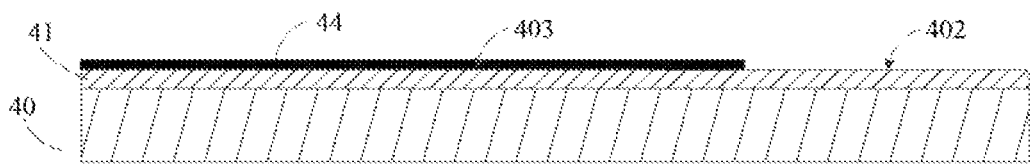
FIG. 8 shows another form of the case during the manufacturing process according to an embodiment of the present disclosure.

After the definition of the second area 403 on the surface of the case 40, a masking layer 44 may be formed on the second area 403 by spraying, as shown in FIG. 8. This masking layer 44 may be used to cover the portion of the first oxidation layer 41 within the second area 403. When the block S140 is performed to remove the portion of the first oxidation layer 41 located within the first area 402, the masking layer may prevent the potential impact to the other portion of the first oxidation layer 41 located within the second area 403.

In some embodiments, the masking layer 44 may be an inkjet coating layer.

In some embodiments, as shown in FIG. 4, the block S140 of removing the portion of the first oxidation layer located within the first area may include the following block:

S141: Etching the surface of the metal case so as to remove the portion of the first oxidation layer located within the first area.

After the masking layer 44 is formed within the second area 403 of the surface of the case 40 by spraying, an etching treatment can be performed to the surface of the case 40 to remove the portion of the first oxidation layer located within the first area 402, as shown in FIG. 9. In detail, etching solution (such as dilute sulfuric acid or dilute hydrochloric acid) can be used for etching the surface of the case 40. The portion of the first oxidation layer 41 located within the first area 402 may be removed because of the reaction between the first oxidation layer 41 and the etching solution, while the other portion of the first oxidation layer 41 located within the second area 403 will not be affected during etching as the masking layer 44 which is resistant to the etching solution is formed on the surface of the case 40 within the second area 403.

In some embodiments, as shown in FIG. 4, after the block S140 of removing the portion of the first oxidation layer located within the first area, the method of manufacturing the case may further include the following block:

S174: Removing the masking layer located within the second area.

Figure 10:
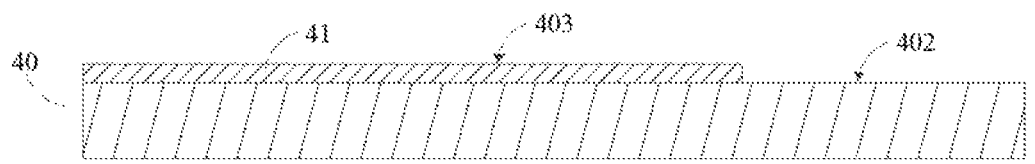
FIG. 10 shows another form of the case during the manufacturing process according to an embodiment of the present disclosure.

Referring to FIG. 9 and FIG. 10, after the removal of the portion of the first oxidation layer 41 within the first area 402, since the subsequent processes will not involve the portion of the first oxidation layer 41 within the second area 403, the masking layer 44 located within the second area 403 can be removed. In detail, either mechanical or chemical treatment, e.g., grinding, milling or etching, can be implemented to remove the masking layer 44 within the second area 403.

In some embodiments, as shown in FIG. 4, after the block S150 of Applying oxidation treatment on the surface within the first area to form the second oxidation layer, the method of manufacturing the case may further include the following block:

S175: Coloring the second oxidation layer to make the second oxidation layer to present a second color.

After the second oxidation layer is formed on the surface of the case within the first area, a coloring treatment can be performed to the second oxidation layer to make the second oxidation layer to present a second color. The detailed coloring treatment processes can refer to the description of step S171 and will not be discussed hereon. After the coloring treatment, the second oxidation layer can present the required second color, such as red. The second color may be different from the first color, and the different parts of the case may present different visual effects to the users.

In some embodiments, as shown in FIG. 4, the paint layer may include a priming paint layer and a finishing paint layer. The block S160 of Forming the paint layer on the second oxidation layer by spraying may include the following blocks:

S161: Spraying priming paint onto the second oxidation layer to form the priming paint layer.

S162: Spraying finishing paint onto the priming paint layer to form the finishing paint layer.

Figure 12:
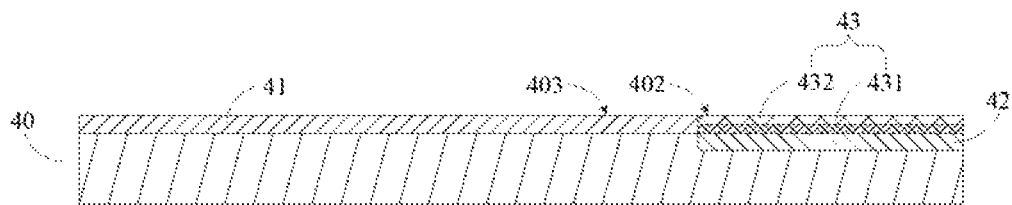
FIG. 12 shows another form of the case during the manufacturing process according to an embodiment of the present disclosure.

As shown in FIG. 12, the paint layer 43 may include the priming paint layer 431 and the finishing paint layer 432. After the second oxidation layer 42 is formed on the surface of the case 40 within the first area 402, priming paint may be sprayed onto the second oxidation layer 42 to from the priming paint layer 431. Afterwards, finishing paint may be sprayed onto the priming paint layer 431 to form the finishing paint layer 432.

The priming paint layer is the first layer of the paint layer. It may improve the adhesion and appearance of the finishing paint layer, and improve the alkaline and corrosion resistance of the structure. It may also ensure the finishing paint layer to be evenly absorbed, hence achieving the best results. The finishing paint layer is the final layer of the paint layer, which is the one presents to the users. The visual effects provided to the users are determined by the finishing paint layer.

In some embodiments, the finishing paint may be made of Ultraviolet Curing Paint (UV paint). The UV paint is also known as photo-curable coating or photosensitizing coating. After being sprayed onto the workpieces, the UV paint can be cured into film in a short period due to the chemical reaction under the irradiation of ultraviolet light.

In some embodiments, after the priming paint layer is formed on the second oxidation layer, a first high temperature treatment can be performed to the surface of the metal case so as to speed up the curing process of the priming paint layer and make the priming paint layer more stable. After the finishing paint layer is formed on the priming paint layer, a second high temperature treatment can be performed to the surface of the metal case so as to accelerate the curing process of the finishing paint layer and improve the stability of the finishing paint layer.

In some embodiments, the first high temperature treatment may refer to a baking process. For example, the surface of the metal case can be baked under a temperature of 80° C. for 30 minutes.

In some embodiments, the second high temperature treatment also can refer to a baking process. For example, the surface of the metal case can be baked under a temperature of 100° C. for 10 minutes.

It needs to clarify that the methods and configurations can be different for the first and the second high temperature treatments.

Figure 13:
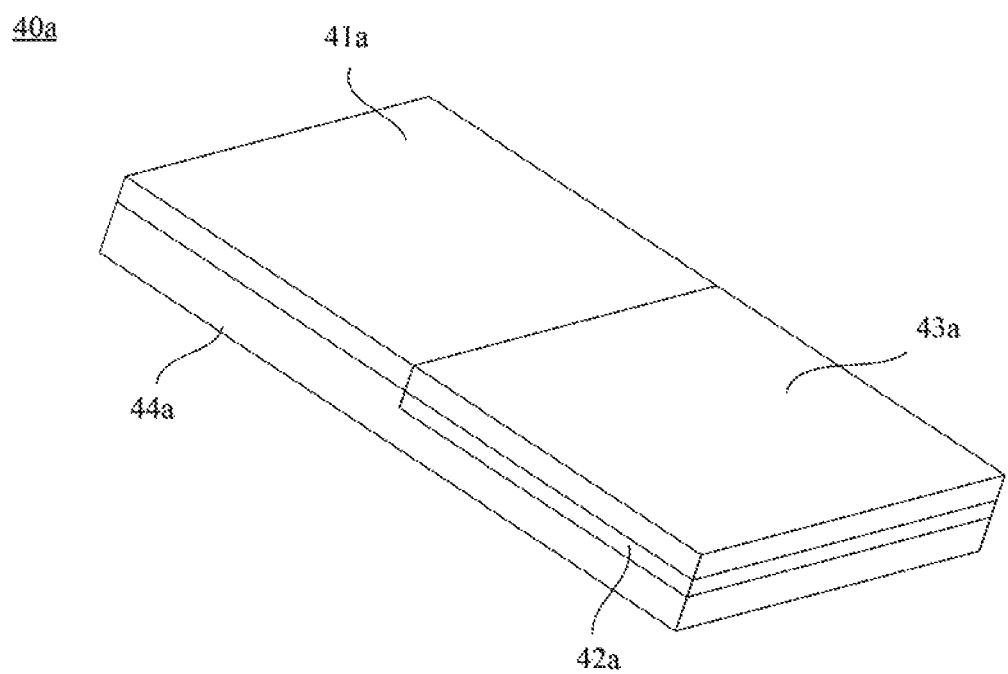
FIG. 13 is a schematic perspective view of the case according to an embodiment of the present disclosure.

Referring to FIG. 13, FIG. 13 shows an exemplary perspective view of the case 40a according to an embodiment of the present disclosure. The case 40a may include a metal substrate 44a, a first oxidation layer 41a, a second oxidation layer 42a and a paint layer 43a.

The metal substrate 44a may be a made of, by way of example, steel, aluminum or aluminum alloy. Although not shown in the figure, those skilled in the art should understand the metal substrate 44a may have a concave configuration seen from the other side such that electronic components may be deposed in the space defined by the case 40a and other enclosures when the case 40a acts as a back case or battery case of an electronic device.

The first oxidation layer 41a may be set on a portion of the metal substrate 44a and at a side of the metal substrate 44a. In this embodiment, the first oxidation layer 41a may be set on the top half portion of the metal substrate 44a and at the back side (with regard to the electronic device) of the case 40a.

The second oxidation layer 42a may be set on another portion of the metal substrate 44a and at the same side of the metal substrate 44a as the first oxidation layer 41a. In this embodiment, the second oxidation layer 42a may be set on the bottom half portion of the metal substrate 44a and also at the back side of the case 40a. There may exist a height difference between a top surface of the first oxidation layer 41a and a top surface of the second oxidation layer 42a along a thickness direction of the metal substrate 44a. The top surface of the first oxidation layer 41a may refer to the surface of the first oxidation layer 41a far away from the metal substrate 44a. Similarly, the top surface of the second oxidation layer 42a may refer to the surface of the second oxidation layer 42a far away from the metal substrate 44a.

The paint layer 43a may be set on the second oxidation layer 42a, more specifically, on the top surface of the second oxidation layer 42a. A top surface of the paint layer 43a, i.e., the surface far away from the metal case 44a, may be substantially flush with the top surface of the first oxidation layer 41a. Therefore, the case 40a may present a flat and smooth appearance to the user.

In some embodiments, the bottom surface of the first oxidation layer 41a which is clung to the metal substrate 44a may be substantially level with the top surface of the second oxidation layer 42a. In addition, the thickness of the paint layer 43a may be substantially the same as that of the first oxidation layer 41a such that the top surface of the paint layer 43a may be substantially level with the top surface of the first oxidation layer 41a.

The case 40a which includes the first oxidation layer 41a, the second oxidation layer 42a, the paint layer 43a and the metal case 44a may be manufactured by any one of the methods described in the above embodiments and will not be discussed hereon.

In some embodiment, the paint layer may include a priming paint layer and a finishing paint layer set on the priming paint layer. In other word, the priming paint layer may be formed between the second oxidation layer 42a and the finishing paint layer 43a to strengthen the adhesion of the finishing paint layer. The finishing paint layer may be made by spraying coating material such as photo-curable coating, and may have a smooth surface, i.e., the top surface of the paint layer 43.

In some embodiment, the first oxidation layer 41a may have a first color while the second oxidation layer 42a may have a second color and the paint layer 43a may be transparent. The first color may differ from the second color, and thus the case 40a may present a dual-color effect to the user.

In some embodiment, the first oxidation layer 41a may be a sandblasting surface. That is to say, during its manufacture, the first oxidation layer 41a may undergo a sandblasting process and its surface may have a graininess texture.

It is to be understood, in other embodiment, the case provided in the present disclosure may have other configuration. For example, as shown in FIG. 14, the case 40b may include a metal substrate 44b, a first oxidation layer 41b, a second oxidation layer 42b and a paint layer 43b, where the first oxidation layer 41b may be located at the left half of the case 40b while the second oxidation layer 42b and the paint layer 43b may be located at the right half of the case 40b.

Figure 14:
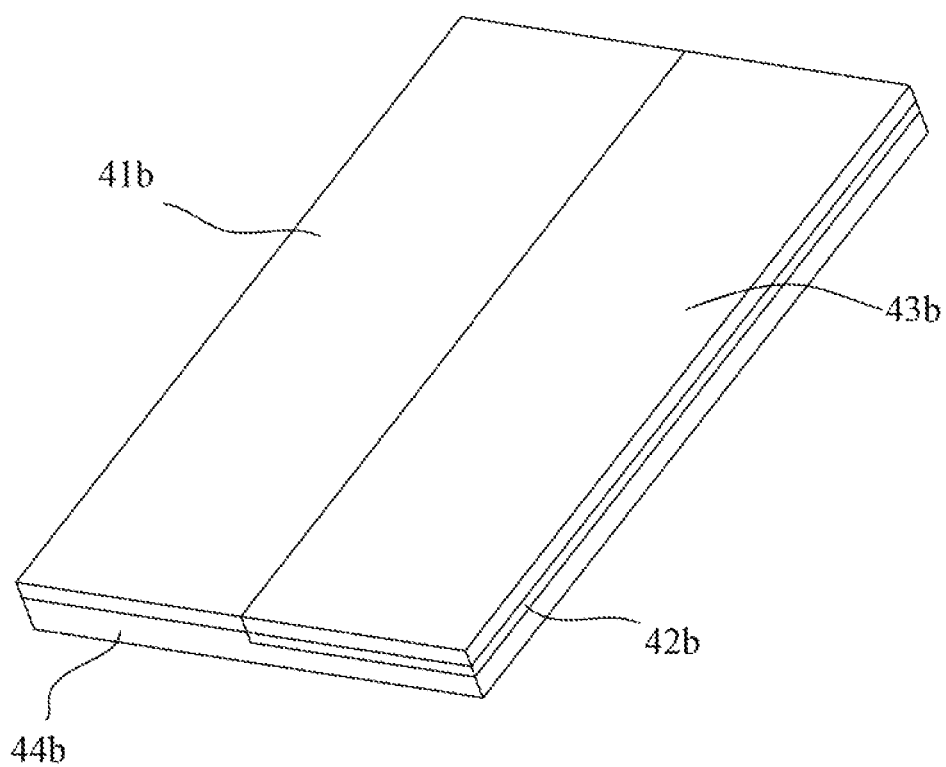
FIG. 14 is a schematic perspective view of the case according to another embodiment of the present disclosure.

Although two different configurations are shown respectively in FIG. 13 and FIG. 14, it is to be understood that the case may also have other configurations. For example, the first oxidation layer and/or the second oxidation layer may have a circular or annular configuration. The first oxidation layer and the second oxidation layer may be separated and may not be in contact with each other. The first oxidation layer together with the second oxidation layer may only covers a portion rather than all of the surface of the metal substrate.

The application has detailed the method of manufacturing the case, the case itself and the electronic device. It also comprehensively explains the theory and implementation method of the application. The example above only aims to assist the understanding of this application. In the meantime, the person skilled in the art can alter the implementation methods and the corresponding application based on the key ideas of the present disclosure. In summary, this instruction should not be considered as restrictions on this application.

What is claimed is:

1. A method of manufacturing a case to be used in electronic devices, comprising:
   providing a metal case with a surface;
   applying a first oxidation treatment on the surface of the metal case to form a first oxidation layer;
   defining a first area on the surface of the metal case;
   removing a portion of the first oxidation layer located within the first area to expose a portion of the metal case within the first area;
   applying a second oxidation treatment on a top face of the portion of the metal case within the first area to form a second oxidation layer; and
   forming a paint coating on the second oxidation layer by spraying, wherein the paint coating is only formed on the second oxidation layer such that an entire top face of the first oxidation layer is substantially at a same height level with an entire top face of the paint coating;
   wherein the paint coating comprises a priming paint layer and a finishing paint layer, and the forming the paint coating on the second oxidation layer by spraying comprises:
   spraying priming paint onto the second oxidation layer to form the priming paint layer; and
   spraying finishing paint onto the priming paint layer to form the finishing paint layer;
   wherein the priming paint layer is only formed on the second oxidation layer, the finishing paint layer is only formed on the priming paint layer directly for improving the adhesion and appearance of the finishing paint layer, while an entire bottom face of the finishing paint layer is contacted with an entire top face of the priming paint layer, the entire top face of the first oxidation layer is substantially at a same height level with an entire top face of the finishing painting layer directly formed on the priming paint layer.

2. The method of claim 1, further comprising:
   before the removing the portion of the first oxidation layer located within the first area,
   defining a second area on the surface, wherein the second area and the first area are not overlapped; and
   forming a masking layer on the first oxidation layer within the second area by spraying.

3. The method of claim 2, wherein the removing a portion of the first oxidation layer located within the first area comprises:
   etching the surface of the metal case to remove the portion of the first oxidation layer located within the first area.

4. The method of claim 2, wherein the masking layer is an inkjet coating layer, and the method further comprises:
   after the removing the portion of the first oxidation layer located within the first area, removing the masking layer within the second area by grinding, milling or etching.

5. The method of claim 1, wherein a height difference between the top face of the first oxidation layer and a top face of the second oxidation layer is equal to a thickness of the first oxidation layer along a thickness direction of the metal case, a thickness of the first oxidation layer substantially equals a thickness of the paint coating.

6. The method of claim 1, further comprising:
   after the applying oxidation treatment on the surface within the first area to form the second oxidation layer,
   coloring the first oxidation layer to make the first oxidation layer to present a first color.

7. The method of claim 1, further comprising:
   after the applying oxidation treatment on the surface within the first area to form the second oxidation layer,
   coloring the second oxidation layer to make the second oxidation layer to present a second color.

8. The method of claim 1, further comprising:
   before the applying oxidation treatment on the surface of the metal case to form the first oxidation layer,
   polishing the surface of the metal case; and
   applying sandblasting on the surface of the metal case to make the surface to be a sandblasting surface.

9. The method of claim 1, further comprising:
   after the applying oxidation treatment on the surface of the metal case so as to form the first oxidation layer,
   forming a thin film layer by applying physical vapor deposition with functional particles on the surface.

10. The method of claim 1, wherein the providing the metal case comprises:
    providing a metal substrate; and
    machining the metal substrate to obtain the metal case.

11. The method of claim 1, further comprising:
    after the spraying the priming paint onto the second oxidation layer to form the priming paint layer, heating the metal case under a first temperature; and
    after the spraying the finishing paint onto the priming paint layer to form the finishing paint layer, heating the metal case under a second temperature.

* * * * *